United States Patent
Luk

(10) Patent No.: US 7,487,571 B2
(45) Date of Patent: Feb. 10, 2009

(54) CONTROL ADJUSTABLE DEVICE CONFIGURATIONS TO INDUCE PARAMETER VARIATIONS TO CONTROL PARAMETER SKEWS

(76) Inventor: Fong Luk, 216 Sweet Rd., Alameda, CA (US) 94502

(*) Notice: Subject to any disclaimer, the term of this patent is extended or adjusted under 35 U.S.C. 154(b) by 385 days.

(21) Appl. No.: 11/290,714

(22) Filed: Nov. 29, 2005

(65) Prior Publication Data

US 2006/0132211 A1    Jun. 22, 2006

Related U.S. Application Data

(60) Provisional application No. 60/631,735, filed on Nov. 29, 2004.

(51) Int. Cl.
*G06F 17/50* (2006.01)
(52) U.S. Cl. .................. 16/4; 716/5; 716/6; 716/16; 714/724; 714/725; 714/726; 324/763; 324/764; 324/765
(58) Field of Classification Search .............. 716/4–6, 716/16; 714/724–726; 324/763–765
See application file for complete search history.

(56) References Cited

U.S. PATENT DOCUMENTS

| | | | | |
|---|---|---|---|---|
| 4,651,038 A | * | 3/1987 | Cline et al. ................. 327/262 |
| 5,684,997 A | * | 11/1997 | Kau et al. ................... 710/260 |
| 6,034,541 A | * | 3/2000 | Kopec et al. ................. 326/39 |
| 6,486,705 B2 | * | 11/2002 | Andrews et al. .............. 326/93 |
| 6,760,873 B1 | * | 7/2004 | Hao et al. ................... 714/724 |
| 6,798,241 B1 | * | 9/2004 | Bauer et al. .................. 326/40 |
| 6,861,864 B2 | * | 3/2005 | Schultz ...................... 324/765 |
| 6,927,591 B2 | * | 8/2005 | McCord ..................... 324/765 |
| 6,983,405 B1 | * | 1/2006 | Herron et al. ............... 714/726 |
| 6,998,892 B1 | * | 2/2006 | Nguyen et al. .............. 327/161 |
| 7,109,730 B2 | * | 9/2006 | Slupsky ...................... 324/753 |
| 2003/0161355 A1 | * | 8/2003 | Falcomato et al. .......... 370/539 |
| 2004/0093388 A1 | * | 5/2004 | Chandler et al. ............ 709/208 |

* cited by examiner

*Primary Examiner*—Naum B Levin
(74) *Attorney, Agent, or Firm*—Bo-In Lin

(57) ABSTRACT

A method is used for configuring an electronic device to reduce a skew of a parameter. The method includes a step of incorporating a plurality of controllable built-in parameter variation adjusting circuits for effecting a small step-change in the parameter at different points of the electronic device for reducing said skew of the parameter. A specific example of the method is to incorporate one or a plurality of field programmable gate arrays for reducing the skew of time delays. Another method is using the capability of programmable data path and loading of FPGA to create programmable delay line and controllable delays.

2 Claims, 1 Drawing Sheet

CONTROL ADJUSTABLE DEVICE CONFIGURATIONS TO INDUCE PARAMETER VARIATIONS TO CONTROL PARAMETER SKEWS

This application is a Formal Application and claims priority to pending U.S. patent application entitled "CONTROL ADJUSTABLE DEVICE CONFIGURATIONS TO INDUCE PARAMETER VARIATIONS TO CONTROL PARAMETER SKEWS" filed on Nov. 29, 2004 and accorded Ser. No. 60/631,735 by the same Applicant of this Application, the benefit of its filing date being hereby claimed under Title 35 of the United States Code.

BACKGROUND OF THE INVENTION

1. Field of the Invention

This invention relates generally to the method and system of control of parameter skews of device operations such as time delay, voltage, current, capacitance, inductance and other parameter skews. More particularly, this invention relates to programmable and accurate parameter skew control by controlling adjustable device configurations to control the parameter skews.

2. Description of the Prior Art

Conventional techniques of electronic device manufacturing and system designs are often confronted with a difficulty that there are parameters skews. Parameters such as time delay, voltage, resistance, inductance and other operational parameters all have uncontrollable and unpredictable variations due to manufacture process variations and other factors. The small variations of these parameters often adversely affect the control and operational accuracy of electronic devices and achievable level of performance. For example, the variation of time delays of between data bits transmitted over data transmission lines often causes the transmission speed to slow down for the purpose of time synchronization.

Therefore, there is still a demand in the art of IC circuit design and manufacture to provide new and improved configurations and method to overcome such difficulties. More specifically, there is an ever-increasing need for data transmission at higher rates. By precisely controlling the time delay with higher accuracy, higher rate of data transmission with different kinds of pipelined technologies can be achieved particularly, if the higher accuracy of time delay control can be implemented.

SUMMARY OF THE PRESENT INVENTION

It is therefore an object of the present invention to provide a new and improved design and manufacture techniques to provide new configurations for controlling the adjustable device configurations to control the parameter skews due to parameter variations such that the above-mentioned prior art difficulty can be overcome.

Specifically, it is an object of the present invention to provide a new circuit configuration by built in parameter adjustable circuits that can be controlled to cause small step variation of a parameter for the purpose of making adjustment of the parameters for reducing difference of parameter variations.

A specific example is to configure a testing device with a field programmable gate array (FPGA) that can be flexible controlled to route signals through different paths and loading wherein each path and loading can be implemented to achieve the task of time delay adjustment which is one of function of IC test system. Further more, multiple test vector data are transmitted over the FPGA routes with controllable time delay by flexibly programming the transmission routes and loading to minimize the timing skew thus more multiple pipelining can be accomplished to enable tests with a very high data rate.

In a preferred embodiment, this invention discloses a method for configuring an electronic device to reduce a skew of a parameter. The method includes a step of incorporating a plurality of built-in parameter variation software or electrical controllable or other means of controlling in adjusting circuits for affecting a small step-change in the parameter at different points of the electronic device for reducing the skew of the parameter. In a specific embodiment, the step of incorporating a plurality of built-in parameter variation adjusting circuits further includes a step of incorporating at least one field programmable gate array (FPGA) for reducing the skew of time delays. In another preferred embodiment, this invention further discloses a method for using a FPGA to made programmable delay line. The method includes a step of using the capability of programmable data path and programmable loading of FPGA to create a programmable delay line for a controllable delay.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
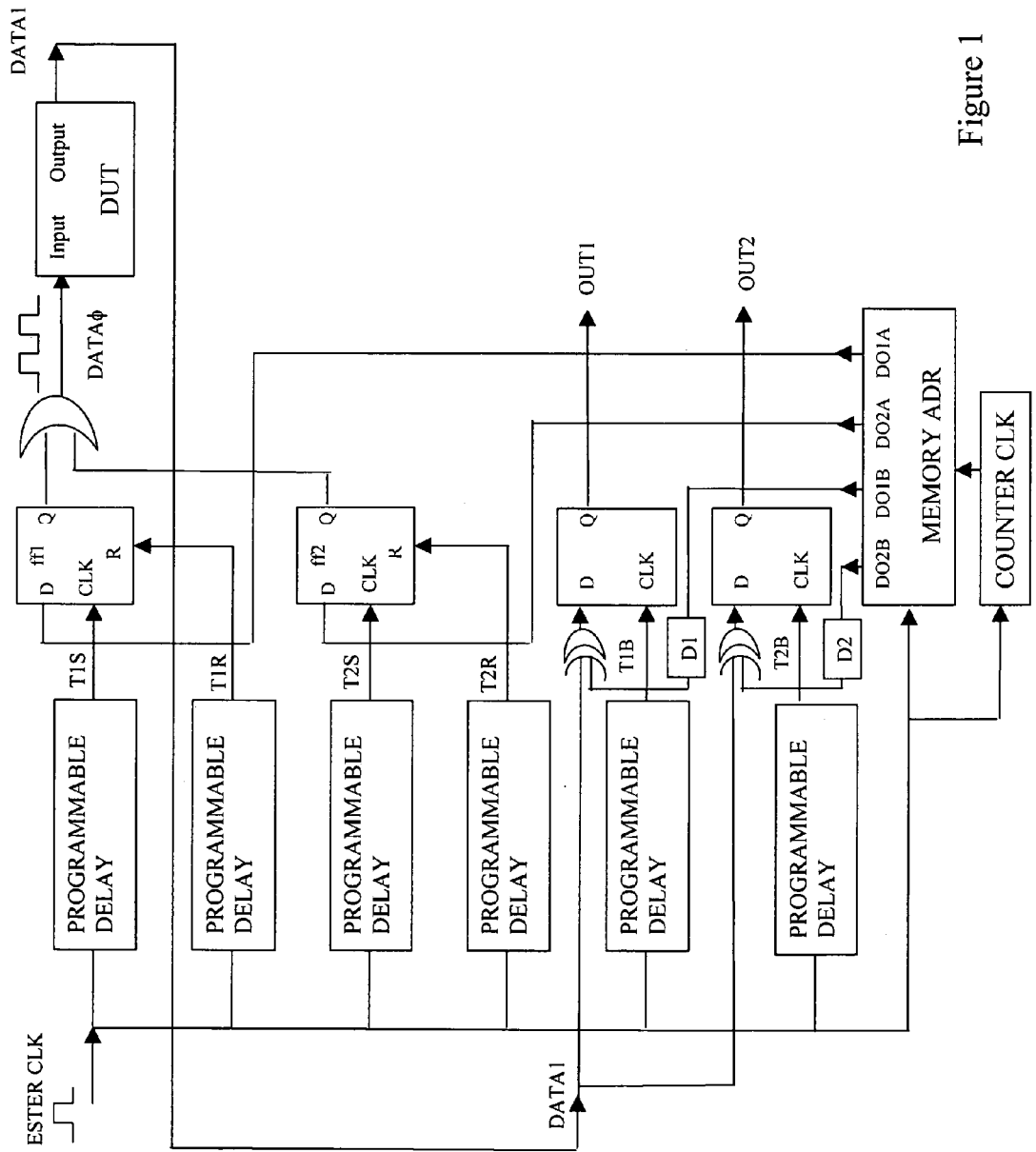
FIG. 1 is a functional block diagram showing an exemplary formatter and timing unit for testing device under test (DUT) implemented with one or an array of FPGA for controlling the time delays.

The present novel invention is a new and novel technique implemented by employing a circuit capable to control certain operational parameter to change in a small stepwise variation. This parameter step-change circuit is inserted into the line of the circuit path. The circuit path in general is critical to the parameter, so the parameter can be adjusted after fabrication. Example of this kind of circuit would be programmable delay line, programmable resister, programmable capacitor and programmable voltage etc. along with RAM, EPROM, EEPROM or flash technology etc. for storing the compensation changes. In this way, the end user or the manufacturer can make necessary adjustment of the parameter of the part after it is fabricated. A new adjustment step to compensate the parameter variation produced by the manufacturing process can be set up by the manufacturer or the end user to use high accuracy measurement instrument to line up the parameter to reduce the skew of pin-to-pin, part-to-part or in system level. Since the control circuit can be software programmable, this adjustment step can be automated.

The built-in parameter variation control device can be implemented by applying a field programmable gate array (FPGA), e.g., the time delay for signal to pass through a gate array cell. For conventional design using FPGA, the signal delay in the FPGA is considered as an undesirable factor and an obstacle that limits the high-speed design application. In this invention, the novel design algorithm makes use of this undesirable property in combining with the path programmable capability of FPGA to accomplish extreme high speed and high precision system design which can be of high speed pipe line system, programmable delay device, high speed IC testing system etc. In this design algorithm, each signal delay is controlled by routing the signal through different path going through more or less active buffer device for larger delay effect and changing the loading along the signal path for fine tuning of the delay. Since the FPGA has the re-routing and load changing capabilities and any device with those similar capability can apply this design method to achieve high accuracy control of the time delays. Using this controlled delay mechanism, pulses with any precise delay and width can be generated and by combining multiple pulses together, any form of digital signal can be formed and pulse rate can be increased. Also by using this method, signals can be sampled in different precise timing and then pipe lined and processed via multiple channels and finally reassembled back (by ORing or by other means) together in the output stage (which can be inside or outside the FPGA), so system speed can be multiplied.

There is one problem in the delay mechanism is needed to be resolved which is that the delays differ when passing through different routing paths of the same length and different loading point of similar loading. To over come this problem, the delay of each path and loading along the critical signal path are to be measured before hand and stored by means of the corresponding digital weight in the timing data base, so precise timing can be programmed by using the timing data base to calculate the exact timing delay of each path and loading and adjust the timing by means of software control. Since all timing can be controlled by software, the building up of the digital timing database can be done automatically by software during production manufacturing. This novel design technique can be used in many area especial in pipe lined systems, high speed IC test system, high speed memory system etc. The techniques as disclosed in this invention can line up the clock input, control input, address input, data input and data output delay time to enable more level of interleave pipelining so the I/O speed can be greatly increased.

FIG. 1 shows a timing delay control unit for a testing system as an example for implementing the FPGA array for timing delay parameter adjustment to transmit test vector data from the memory. The time signals T1S, T1R, T1B, T2S, T2R, and T2B are timing within one tester clock period. Test vectors D01A, D02A are read and transmitted at the rising edge of tester clk. The tester clk is delayed from shorter to longer delay time into t1s,t1r t2s and t2r, t1s will clock in d01a into the d-fliplop ff1 and then later rested by t1r so if d01a is one, the out put from ff1 is a plus with delay and plus width controlled by t1s and t1r. Similarly the output from ff2 is a plus with delay and plus width controlled by t2s and t2r. By controlling the delay of t1s,t1r,t2s,t2r and Oring the output from ff1 and ff2, D01A and D02A are multiplex into DATA0 with two pluses corresponding to D01A and D02A respectively thus doubling the data rate. The response data D01B and D02B are expected output data for comparisons with DUT output data DATA1 at time T1B and T2B respectively. Delay units D1 and D2 are added to delay D01B and D02B respectively to compensate the delay from DATA0 to DATA1. By implementing a data format and timing unit as shown in FIG. 1, The tester has a data rate of DATA0 that is input data for the DUT which is twice the data rate of the tester clock.

According to above descriptions, this invention discloses a method for configuring an electronic device to reduce a skew of a parameter. The method includes a step of incorporating a plurality of controllable built-in parameter variation adjusting circuits for affecting a small step-change in the parameter at different points of the electronic device for reducing the skew of the parameter. In a preferred embodiment, the step of incorporating a plurality of controllable built-in parameter variation adjusting circuits further includes a step of incorporating at least one field programmable gate array (FPGA) for reducing the skew of time delays. In another preferred embodiment, this invention discloses a method for using a FPGA to made programmable delay line. The method includes a step of using the capability of programmable data path and loading of FPGA to create a programmable delay line for a controllable delay.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for manufacturing, testing and adjusting an electronic device comprising:

incorporating a plurality of controllable built-in parameter variation adjusting circuits having an adjustable range of said parameter variation as part of operational circuits of said electronic device for affecting a small step-change in said parameter at different points of said electronic device; and testing said electronic device by applying a high accuracy measurement instrument to perform an after fabrication adjustment to said controllable built-in parameter adjusting circuits whereby a fabrication cost of said electronic device may be reduced without requiring implementation of high precision circuits with tightly controlled ranges of parameter variations.

2. The method of claim 1 wherein:

said step of incorporating a plurality of controllable built-in parameter variation adjusting circuits further includes a step of incorporating at least one field programmable gate array (FPGA) for allowing for said performance of said after fabrication adjustment by applying a programmable control to said FPGA after fabrication of said electronic device.

* * * * *